United States Patent [19]
Casey et al.

[11] Patent Number: 5,504,986
[45] Date of Patent: Apr. 9, 1996

[54] METHOD OF MANUFACTURING COLLINEAR TERMINATED TRANSMISSION LINE STRUCTURE WITH THICK FILM CIRCUITRY

[75] Inventors: John F. Casey, Colorado Springs; Ronald W. Schroeder; Lewis R. Dove, both of Monument; Philip J. Yearsley, Colorado Springs, all of Colo.

[73] Assignee: Hewlett-Packard Company, Palo Alto, Calif.

[21] Appl. No.: 397,594

[22] Filed: Mar. 2, 1995

[51] Int. Cl.$^6$ ................................................. H01C 17/06
[52] U.S. Cl. ................... 29/620; 29/847; 219/121.69; 338/195; 427/101
[58] Field of Search ............... 216/16; 29/620, 29/847; 219/121.68, 121.69; 338/195; 427/101

[56] References Cited

U.S. PATENT DOCUMENTS 4,146,673  3/1979  Headley ............................ 219/121.69

OTHER PUBLICATIONS

"Photomask Coating" Transene Company, Inc. Bulletin No. 227, Jan. 1980 1 page.
"BIROX Series 17 Resistor compositions" DuPont Electronics pp.1–16 Jul. 1991.

*Primary Examiner*—P. W. Echols
*Attorney, Agent, or Firm*—Patrick J. Murphy

[57] ABSTRACT

A collinear terminated transmission line structure and method for producing same is presented. The structure comprises a plurality of conductors electrically connected to a plurality of resistors. A predetermined spacing between each of the plurality of conductors ranges from 2 mils to 7 mils. Greater spacings are easily accomplished with the present method. The method comprises the steps of screen-printing a resistor swath onto a substrate, the swath being adjacent to one end of the plurality of conductors. After the substrate is dipped into a solution, the resistor swath is laser trimmed to form the plurality of resistors. The substrate is then rinsed with warm water to remove the solution. The solution can be a poly-vinyl alcohol and isopropyl alcohol mixture.

2 Claims, 7 Drawing Sheets

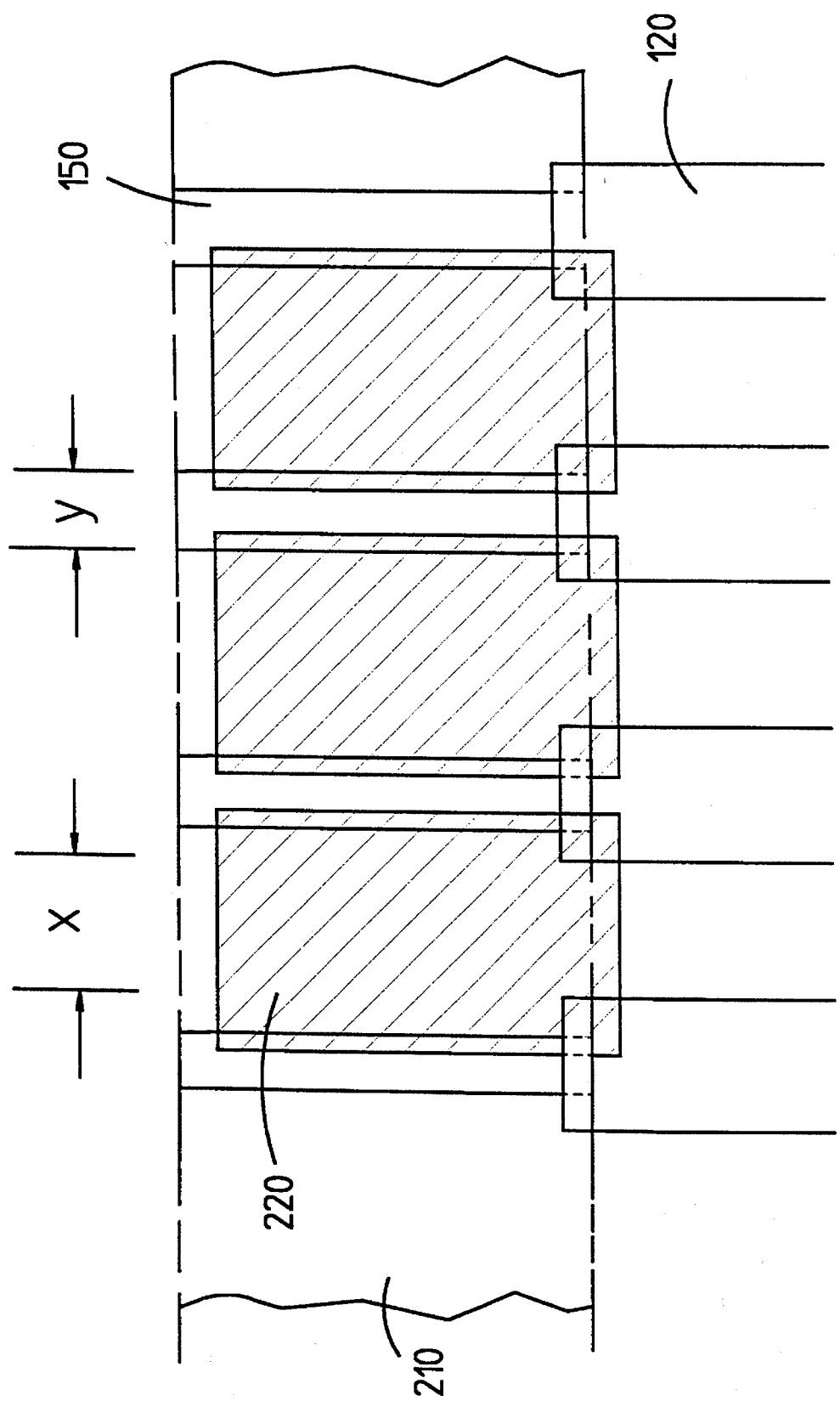

METHOD OF MANUFACTURING COLLINEAR TERMINATED TRANSMISSION LINE STRUCTURE WITH THICK FILM CIRCUITRY

FIELD OF THE INVENTION

The present invention relates generally to hybrid circuits and more particularly to a collinear terminated transmission line structure and method for producing same.

BACKGROUND OF THE INVENTION

Hybrid circuits can be fabricated on an insulating substrate comprised of an alumina or similar ceramic. The hybrid circuit combines any number of thick- or thin-film components, semiconductor devices and discrete parts such as capacitors. Hybrid circuits are typically employed in high frequency and microwave applications, although low frequency applications can also be implemented. In many cases, an insulated lid is attached to the substrate encapsulating the circuitry. In high power applications, it is often desirable to include a heat sink. Typically, a heat sink is directly attached to the inactive side of the hybrid with thermal epoxy.

In the design and manufacture of electronic devices that are operated at high frequencies, the electrical interconnection between circuits is of great concern. An interconnection must be treated as a controlled-impedance transmission line when the interconnection dimension becomes a significant fraction of the signal wavelength (typically 1/10 to 1/8 of the wavelength is considered significant). At some high frequencies, and microwave frequencies (i.e., frequencies greater than 1 Ghz) nearly all circuit interconnections meet this criterion and, consequently, must be designed as controlled-impedance transmission lines. Interconnections which do not match the characteristic impedance of the circuit, as well as those that are not field matched, result in signal reflections and, thus, loss of power transmission and signal integrity.

Typically, a high frequency circuit, which is attached to the substrate, will have conductive pads that are etched near the perimeter of the circuit. These pads are electrically connected via wire bonding to conductive leads that are etched or printed onto the substrate. In order to provide a controllable interconnection between the pads and leads, a resistor often terminates each lead. A problem with this technique is that each terminating resistor is printed as a single instance. This conventional technique increases the chance for process errors and non-uniform terminating resistors since multiple screen prints are required to terminate multiple leads. Furthermore, the terminating resistor contains slag as a result of laser trimming to precise value. This slag additionally ends up on the conductive leads which impedes the wire bond. Still further, conventionally printed and laser trimmed resistors do not facilitate dense packaging due to their typical thickness (i.e., approximately 10–20 mils).

SUMMARY OF THE INVENTION

The present invention provides a collinear terminated transmission line structure with minimal laser slag and fine-pitched spacing. The present structure comprises a plurality of resistors which are laser-trimmed from a larger screen-printed resistor swath. The plurality of resistors are electrically connected to a plurality of conductive leads. Spacing between each of the plurality of resistors complements a predetermined spacing between each of the plurality of conductive leads, facilitating dense packaging with respect to thick-film circuitry. The present structure is relatively slag-free.

The present invention can also be viewed as a method for fabricating the present collinear terminated transmission line structure. Specifically, the present method comprises the steps of: fabricating a substrate; screen printing a resistor swath onto the substrate; furnace firing; dipping the substrate into a solution; laser trimming the resistor swath to produce a plurality of resistors; and rinsing the substrate with warm water. In one preferred embodiment, the solution into which the substrate is dipped is a poly-vinyl alcohol and isopropyl alcohol mixture.

BRIEF DESCRIPTION OF THE DRAWINGS

FIG. 2 shows a top view of the collinear terminated transmission line.

FIG. 3b shows a side surface view of the thick-film resistor of FIG. 3a.

DETAILED DESCRIPTION OF THE PREFERRED EMBODIMENT

A collinear terminated transmission line structure with minimal laser slag and fine-pitched spacing is presented. The present structure comprises a plurality of resistors which are laser-trimmed from a resistor swath. The plurality of resistors are electrically connected to a plurality of conductive leads. The fine-pitched spacing is a predetermined spacing between each of the plurality of conductive leads.

Figure 1:
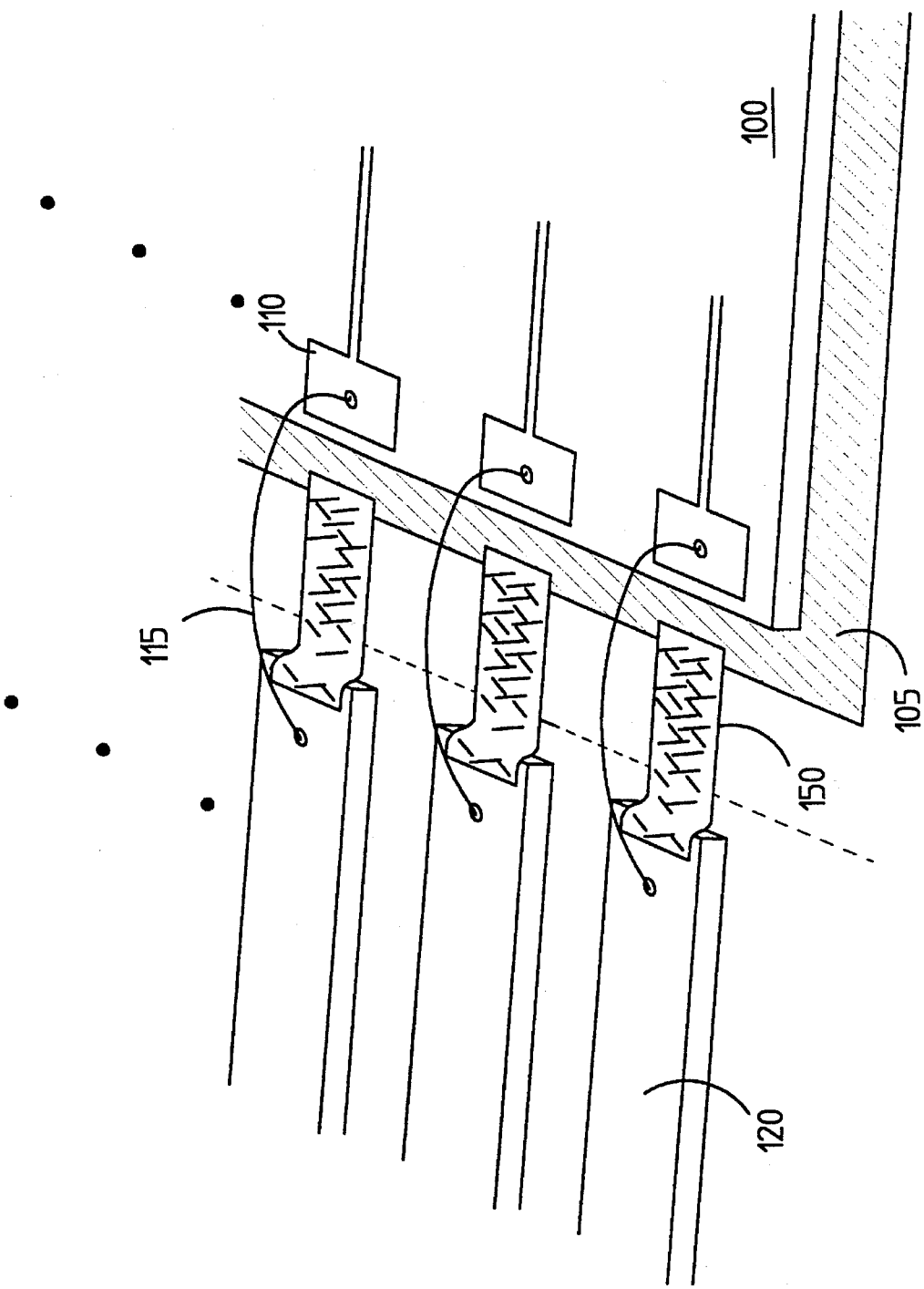
FIG. 1 shows a perspective view of the collinear terminated transmission line according to the present invention.

FIG. 1 shows a perspective view of the collinear terminated transmission line according to the present invention. A high frequency circuit 100 is attached to a substrate (not shown) in a conventional manner. The substrate can be made of alumina, for example. A ground plane 105 is disposed below the circuit 100 and is electrically connected to a ground plane below the substrate. The circuit 100 comprises a plurality of conductive pads 110 that are spaced some predetermined distance apart. In a preferred embodiment, the pads 110 are aluminum- or gold-plated and are spaced between 2–7 mils apart. The ground plane 105 may also be gold-plated. Other conductor types (e.g., palladium silver) and other spacings (e.g., 7–20 mils) can be used without departing from the scope of the present invention.

A plurality of conductive leads 120 are positioned on the substrate and are aligned with the conductive pads on the circuit 100. The number of conductive leads 120 can be equal to the number of conductive pads 110. Each conductive lead 120 is electrically connected to a related conductive pad 110 through a wire bond 115. Resistors 150 connect the conductive leads 120 to the ground plane 105. In one preferred embodiment, each of the conductive leads 120 has a characteristic impedance. In another preferred embodiment, the ohmic value of each resistor 150 is equal to the characteristic impedance of the conductive lead 120. In yet another embodiment, the ohmic value of each resistor 150 is equal to 50 ohms.

FIG. 2 shows a top view of the collinear terminated transmission line. The collinear terminated transmission line comprises a plurality of conductive leads 120 connected to an equal plurality of thick-film resistors 150. The plurality of conductive leads 120 have a predetermined fine pitch spacing, x. In a preferred embodiment, x is equal to 5 mils, although other values for x could be used, for example 5–20 mils, without departing from the scope of the present invention. Conventional screen printing and laser trimming techniques are usually considered suitable for x greater than 20 mils.

A swath of thick-film resistor material 210 is printed onto the front side of the substrate, adjacent to the plurality of conductive leads 120. After being dipped into a solution, this swath 210 is then laser etched creating laser trim areas 220. The resultant thick-film resistors 150 that remain are resistors having a uniform thickness and are relatively free of laser slag. The resistors 150 have a width, y, that in a preferred embodiment is 3 mils. Thick-film resistors which are only 3 mils in width provide a tremendous advantage for dense packaging (e.g., 3-mil resistors can accommodate dense thick-film packaging wherein the conductive pads of a high frequency circuit are spaced only 5 mils apart). Another advantage of 3-mil resistors is that field matching is facilitated. Parasitics, such as parasitic capacitance and inductance, that are associated with conductive lead/resistor pairs typically interfere with signal integrity. Parasitics are directly related to size; that is, parasitics scale with geometry so that a 3-mil wide resistor has smaller parasitics than a 10-mil wide resistor.

In one preferred embodiment, the swath 210 is 20 mils wide and 2" (50.8 mm) in length. The collinear terminated transmission line can be extended up to the maximum dimensions allowed by the current substrate technology. Presently, 4" (101.6 mm) in length accommodates a variety of substrate and chip sizes. Extension beyond 4" is well within the scope of the present invention.

Figure 3A:
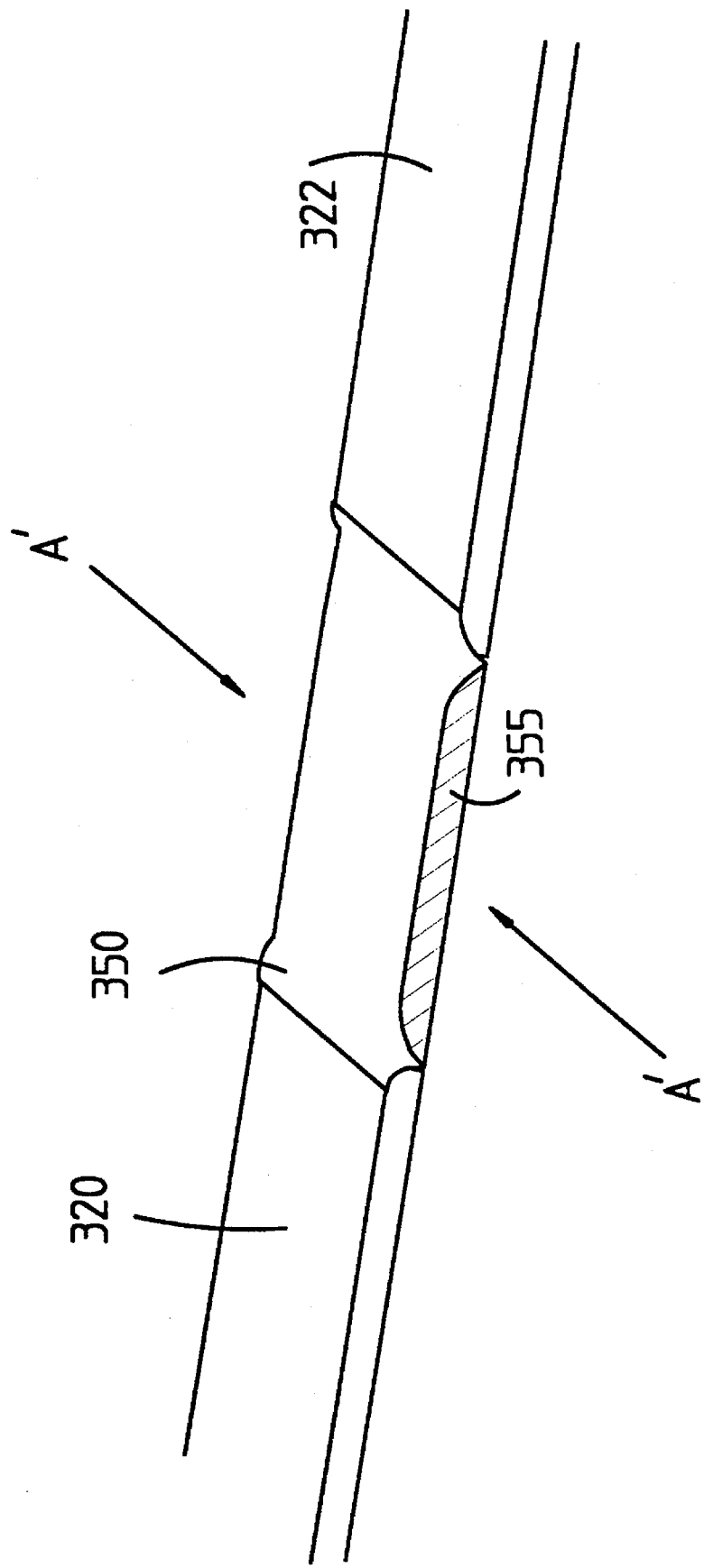
FIG. 3a shows a perspective view of a thick-film resistor disposed between two conductors.

FIG. 3a shows a perspective view of a single instance of a thick-film resistor disposed between two conductors. Conductor 320 is aligned with conductor 322, representing a ground connection. For illustrative purposes, conductors 320 and 322 are etched conductors disposed upon a substrate A thick-film resistor 350 electrically connects conductor 320 to conductor 322. After the resistor 350 is deposited on the substrate, a portion 355 is laser trimmed away on one side of the resistor 350.

Figure 3B:
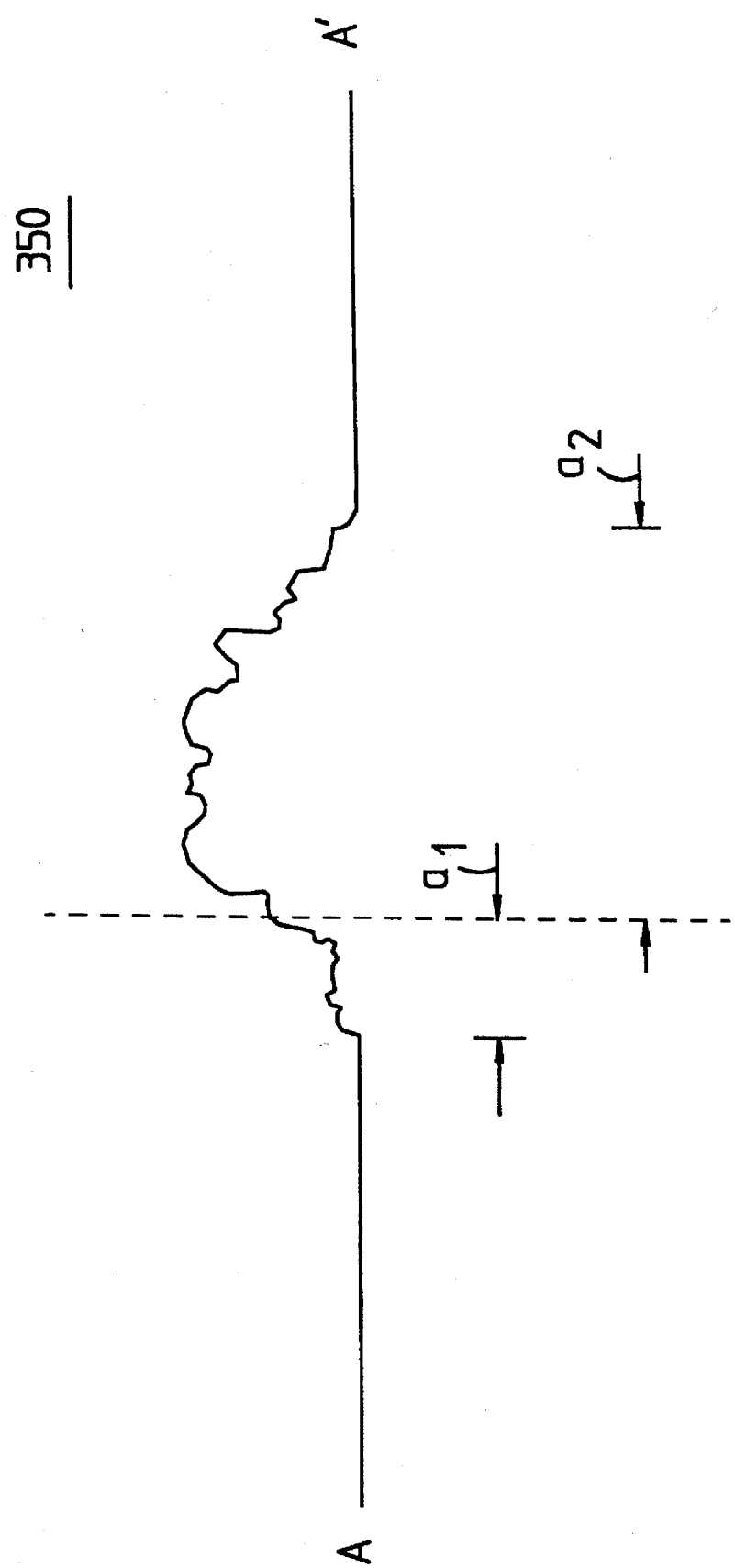

FIG. 3b shows a cross-sectional view of the thick-film resistor of FIG. 3a. The resistor 350 has a non-uniform surface. The portion 355 that has been laser trimmed is represented by $a_1$; $a_2$ represents the remaining resistor 350 material. As illustrated in FIG. 3b, the laser trim caught a thin portion of the resistor ($a_1$). Unfortunately, thick-film resistors that are screen printed in single instances do not provide sufficient control for the laser trim process, especially as the size of the resistor is reduced. Conventional laser-etched resistors are considered "small" at 20 mils. Conventional resistors at 20 mils, or even 10 mils, do not accommodate densely packaged thick-film circuits.

Figure 4:
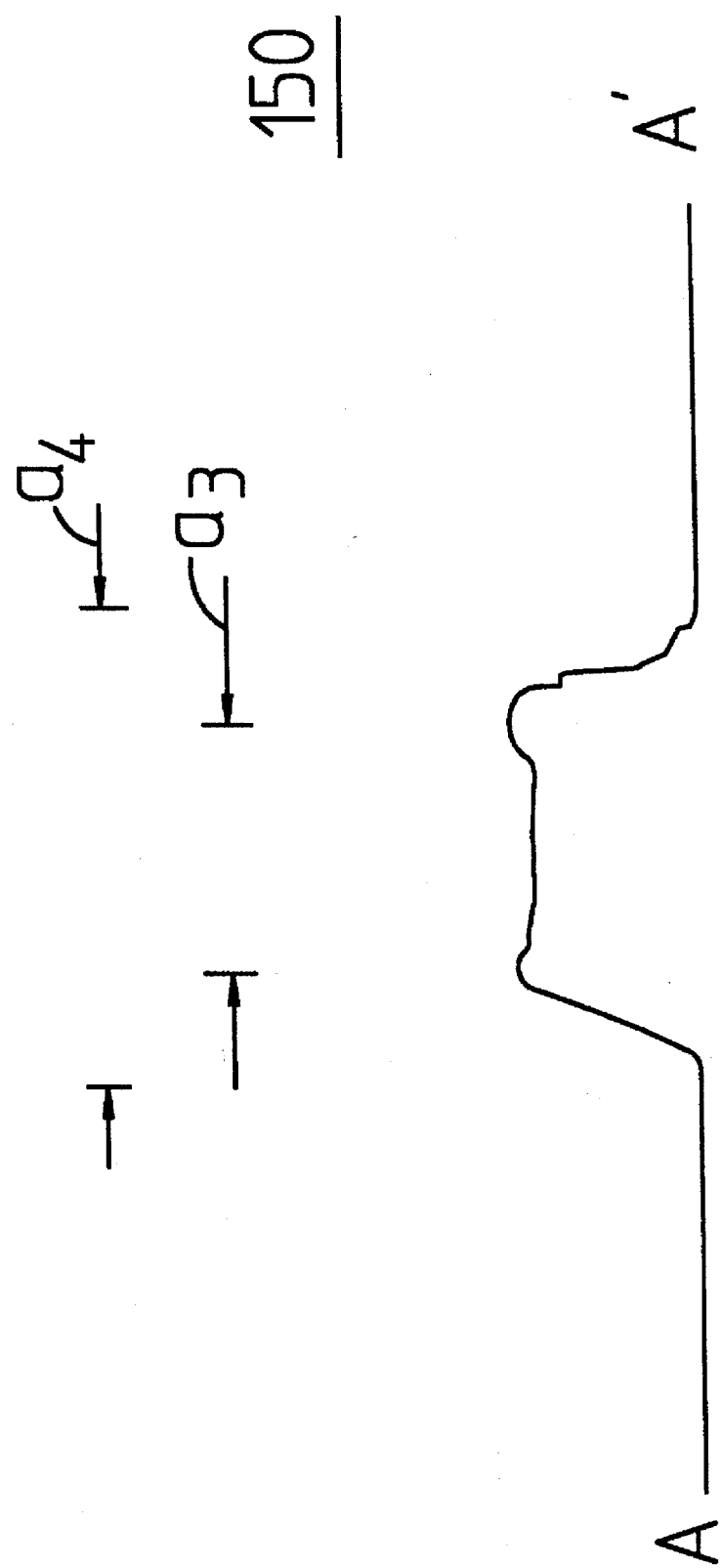
FIG. 4 shows a side surface view of one thick-film resistor of the collinear terminated transmission line shown in FIGS. 1 and 2.

FIG. 4 shows a cross-sectional view of one thick-film resistor of the collinear terminated transmission line shown in FIGS. 1 and 2. By contrast to the resistor of FIGS. 3a and b, the cross-sectional view of this resistor 150 shows that the majority of surface area, $a_3$, is smooth. This smoothness is indicative of the uniformity of the resistor 150. One reason the resistor 150 is so uniform is due to the fact that it was laser trimmed from the larger, screen-printed resistor swath. Another reason the resistor 150 is uniform results from the present method (described more fully below with respect to FIGS. 5a and 5b) which dips the substrate, along with the swath, into a solution prior to laser trimming. The solution forms a protective coating on the substrate and swath to collect any laser slag created during the trimming process. "Mouse ears" 410 are formed at the edges of the resistor 150 from the reflow process after being laser-trimmed.

Figure 5A:
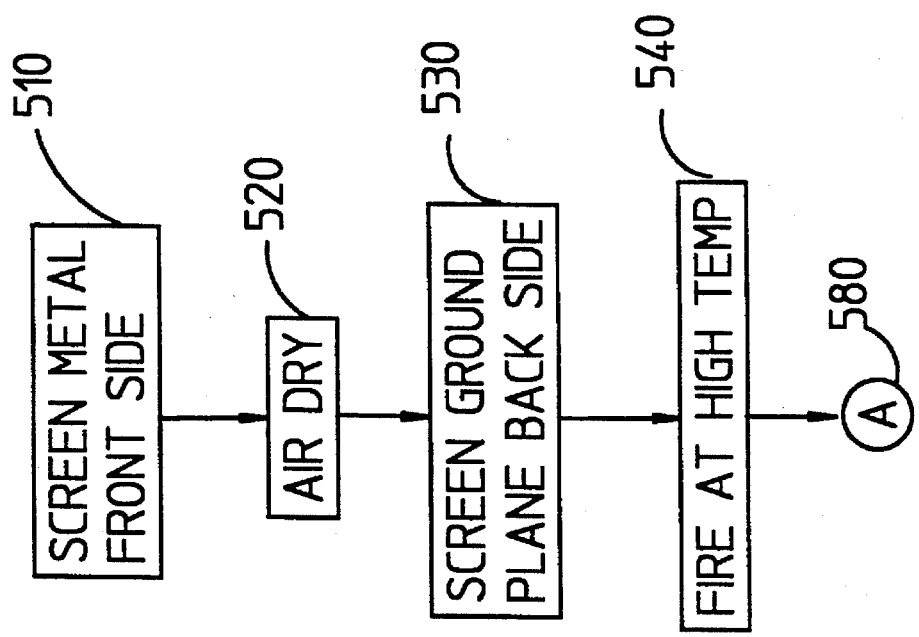
FIGS. 5a and 5b show a flow diagram of the method for producing the collinear terminated transmission line according to the present invention.
Figure 5B:
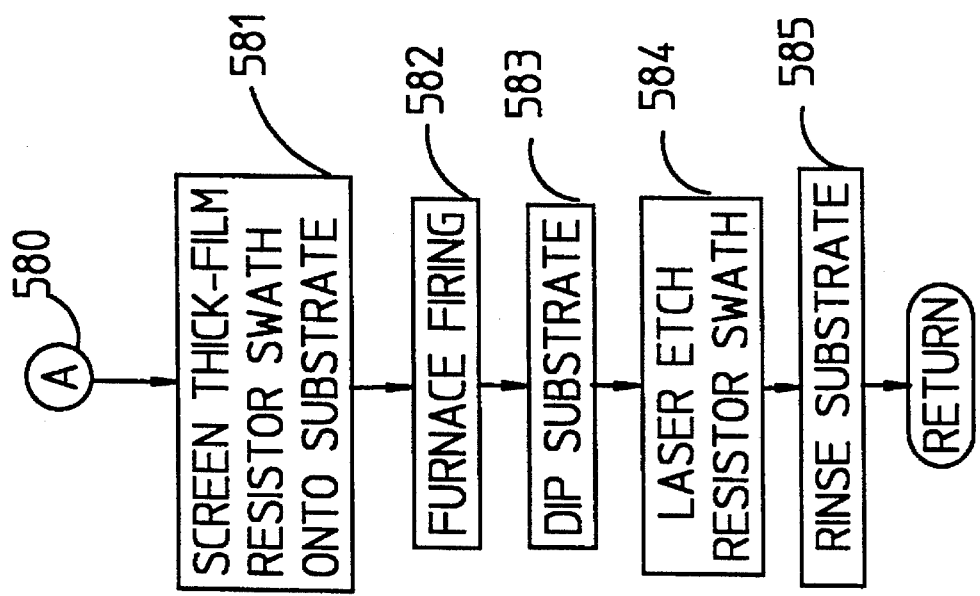

FIGS. 5a and 5b show one preferred embodiment of a flow diagram for the method of producing the collinear terminated transmission line according to the present invention. The process begins with screen printing the metal front side of a substrate (block 510). The substrate can be made of ceramic, for example. The screened metal is then air dried (block 520). The ground plane is then screen printed on the back side of the substrate (block 530) before the package is fired at a high temperature (block 540). Control is then passed to item 580.

Referring to FIG. 5b, block 581 screen prints a thick-film resistor swath onto the front side of the substrate. In a preferred embodiment, the resistor swath is BIROX Series 17 Resistor Composition manufactured by DuPont Electronics, Wilmington, Del., USA. The substrate with the screen-printed resistor swath is furnace fired (block 582) for a predetermined time at a predetermined temperature. The substrate, along with the resistor swath, is then dipped into a solution (block 583) before the resistor swath is laser trimmed (block 584). The solution provides a protective coating for the substrate and swath so that the laser trimming step (block 584) can proceed relatively slag-free. After the laser trimming is completed, the substrate is rinsed in warm water (block 585), thus removing the solution and any laser slag before returning to FIG. 5a. In a preferred embodiment, the laser used to trim the resistor swath is a yttrium-aluminum garnet (YAG) crystal laser operated at approximately 1.5 watts and a 1064 nm wavelength. Either a $CO_2$ or excimer laser could alternatively be used without departing from the scope of the present invention.

In a preferred embodiment, the solution used at block 583 is a poly-vinyl alcohol and isopropyl alcohol mixture. In another preferred embodiment, the solution is Transene Photomask Coating-2060, manufactured and made available by Transene Company, Inc., of Mass., USA.

While the present invention has been illustrated and described in connection with the preferred embodiments, it is not to be limited to the particular structures and methods shown. It should be understood by those skilled in the art that various changes and modifications may be made within the purview of the appended claims without departing from the true scope and spirit of the invention in its broader aspects.

We claim:

1. A method for producing a collinear terminated transmission line structure comprising the steps of:

(1) fabricating a substrate;

(2) screen printing a plurality of conductors onto the substrate;

(3) screen printing a resistor swath adjacent to one end of the plurality of conductors;

(4) dipping the substrate into a solution;

(5) laser trimming the resistor swath to produce a plurality of resistors, each of the plurality of resistors aligned with each of the plurality of conductors; and (6) rinsing the substrate with warm water, thereby removing the solution.

2. The method of claim 1, wherein the solution of step (4) is a poly-vinyl alcohol and isopropyl alcohol mixture.

* * * * *